US006297068B1

(12) United States Patent
Thornton

(10) Patent No.: US 6,297,068 B1
(45) Date of Patent: Oct. 2, 2001

(54) METHOD FOR HIGHLY COMPACT VERTICAL CAVITY SURFACE EMITTING LASERS

(75) Inventor: Robert L. Thornton, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/282,805

(22) Filed: Mar. 31, 1999

Related U.S. Application Data

(62) Division of application No. 08/940,867, filed on Sep. 30, 1997, now Pat. No. 5,978,408
(60) Provisional application No. 60/037,175, filed on Feb. 7, 1997.

(51) Int. Cl.$^7$ .................................................... H01L 21/00
(52) U.S. Cl. .............................................................. 438/46
(58) Field of Search ................................ 438/22, 34, 38, 438/39, 45, 46, 47; 372/45, 46; 257/13

(56) References Cited

U.S. PATENT DOCUMENTS

| 5,359,618 | 10/1994 | Lebby et al. ............................ 372/45 |
| 5,373,522 | * 12/1994 | Holonyak et al. . |
| 5,493,577 | 2/1996 | Choquette et al. ..................... 372/46 |
| 5,719,891 | 2/1998 | Jewell .................................... 372/45 |
| 5,719,892 | 2/1998 | Jiang et al. ............................ 372/45 |
| 5,896,408 | 4/1999 | Corzine et al. ........................ 372/46 |

FOREIGN PATENT DOCUMENTS

09223841 A   8/1997   (JP) .

OTHER PUBLICATIONS

Chua, C.L. Et Al. "Planar Laterally Oxidized Vertical–Cavity Lasers for Low–Threshold High–Density Top–Surface–Emitting Arrays," IEEE Photonics Technology Letters, vol. 9, No. 8, Aug. 1, 1997; pp.1060–1062.

Evans, P.W. Et Al. "Edge–Emitting Quantum Well Heterostructure Laser Diodes with Auxilliary Native–Oxide Vertical Cavity Confinement," Applied Physics Letters, vol. 67, No. 21, Nov. 20, 1995; pp. 3168–3170.

Huffaker, D.L. Et Al. "Fabrication of High–Packing–Density Vertical Cavity Surface–Emitting Laser Arrays Using Selective Oxidation," IEEE Photonics Technology Letters, vol. 8, No. 5, May 1, 1996; pp. 596–598.

Japanese Search Report for corresponding Application No. 10–24169, dated May 18, 1999.

* cited by examiner

Primary Examiner—K Christianson

(57) ABSTRACT

The present invention provides a method for making highly compact vertical cavity surface emitting laser by a lateral oxidation process. Specifically, the present invention allows for the use of well-controlled oxidized regions to bound and to define the aperture of a laser structure in a current controlling oxidation layer, wherein the aperture comprises a conductive region in the oxidation layer. These oxidized regions are formed by the use of a pre-defined bordering pattern of cavities etched in the laser structure, which allow the embedded oxidation layer to be oxidized, and which results in a highly reproducible and manufacturable process.

10 Claims, 10 Drawing Sheets

US 6,297,068 B1

METHOD FOR HIGHLY COMPACT VERTICAL CAVITY SURFACE EMITTING LASERS

RELATED APPLICATIONS

This is a division of application Ser. No. 08/940,867, filed Sep. 30, 1997 now U.S. Pat. No. 5,978,408 which claims the benefit of U.S. Provisional Application No. 60/037,175, filed Feb. 7, 1997.

FIELD OF INVENTION

The present invention relates generally to semiconductor lasers. More specifically, the invention allows for the formation of highly compact and well-defined vertical cavity surface emitting lasers.

BACKGROUND OF INVENTION

Solid state semiconductor lasers are important devices in applications such as optoelectronic communication systems and high-speed printing systems. Recently, there has been an increased interest in vertical cavity surface emitting lasers ("VCSEL's") although edge emitting lasers are currently used in the vast majority of applications. A reason for the interest in VCSEL's is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSEL's incorporate the mirrors monolithically in their design, they allow for on-wafer testing and the fabrication of one-dimensional or two-dimensional laser arrays.

A known technique to fabricate VCSEL's is by a lateral oxidation process, as schematically illustrated in FIGS. 1 and 2. Under this approach, a laser structure comprising a plurality of layers is formed upon substrate 10. These layers include an active layer 12 and an AlGaAs layer 14 with a high aluminum content. The AlGaAs layer 14 is placed either above or below the active layer of a laser structure. Then, the layered structure is masked and selectively etched to form a mesa structure 22 as illustrated in FIG. 2. As a result of the etching, the AlGaAs layer 14 with a high aluminum content adjacent to the active layer 12 is exposed at the edges of the mesa structure 22. To form the lasing emissive region or "aperture", this AlGaAs layer is oxidized laterally from the edges towards the center of the mesa structure as represented by arrows A. Other layers in the structure remain essentially unoxidized since their aluminum content is lower. Consequently, their oxidation rates are also substantially lower. Therefore, only the AlGaAs layer with high aluminum content is being oxidized. The oxidized portions of the high aluminum content layer become electrically non-conductive as a result of the oxidation process. The remaining unoxidized region, which is conductive, in the AlGaAs layer forms the so-called "aperture", a region which determines the current path in the laser structure, and thereby determines the region of laser emission. A VCSEL formed by such a technique is discussed in "Selectively Oxidized Vertical Cavity Surface Emitting Lasers With 50% Power Conversion Efficiency," Electronics Letters, vol. 31, pp.208–209 (1995).

The current lateral oxidation approach has several disadvantages, such as large mesa, large oxidation region, and poor control of the aperture size. A key disadvantage of this approach is the difficulty in controlling the amount of oxidation. Generally, the desired device aperture is on the order of one to ten microns ($\mu m$), which means that several tens of microns of lateral oxidation will typically be required in order to fabricate the device when oxidizing in from the sides of the much larger mesa, which must typically be 50 to 100 microns in size. Since the size of the resulting aperture is small relative to the extent of the lateral oxidation regions, the devices formed generally have severe variations in aperture size as a result of non-uniform oxidation rates from wafer to wafer and across a particular wafer. The oxidation rate of AlGaAs depends strongly on its aluminum composition. Any composition non-uniformity will be reflected by changes in the oxidation rate, which in turn creates uncertainty in the amount of oxidation. The process is also relatively temperature-sensitive. As the oxidation rate varies, it is difficult to ascertain the extent to which a laser structure will be oxidized, thereby decreasing reproducibility in device performance. In short, such a process often creates various manufacturability and yield problems.

Another disadvantage of a VCSEL formed by a traditional lateral oxidation approach is the difficulty it creates in forming high density laser arrays. In order to oxidize a buried layer of high aluminum content, an etching process is performed leaving a mesa. After the etching of this mesa, lateral oxidation is performed such that the oxidized regions define a laser aperture of a particular size. The use of a mesa structure, in part, limits the minimum spacing between two lasers in an array. The step height of the mesa is typically several microns because of the need to etch through a thick upper DBR mirror. Additionally, the top surface of the mesa also has to be relatively large so that a metal contact can be formed on It without covering the lasing aperture. Typically, the minimum size of an electrical contact is approximately $50 \times 50 \ \mu m^2$. Hence, the step height of the mesa and the placement of the electrical contact on the surface make it difficult to form highly compact or high density laser arrays.

A solution to some of the problems associated with a typical mesa structure is the use of a shallow mesa. In order to use a shallow mesa, the upper mirror is not formed by an epitaxial process. Instead, the upper mirror is formed by a deposited multilayer dielectric material, which reflects light. Electrical contact is made directly onto the upper portion of the active region. Devices formed under this approach have been fabricated on mesas with widths of approximately twelve microns. However, the added complexity of depositing a dielectric material and using a liftoff process to define the contact make it difficult to optimize the devices for low threshold current and high efficiency.

Lastly, a VCSEL formed by a traditional lateral oxidation approach often suffers from poor mechanical or structural integrity. It is well-known that the upward pressure applied during a packaging process may cause delamination of the entire mesa since the bonding of the oxide layer to the unoxidized GaAs or AlGaAs is generally weak.

BRIEF SUMMARY OF INVENTION

The present invention provides a highly compact VCSEL structure having well-defined and well-controlled oxidized regions, which can be used to define the lasing aperture of a laser structure. These oxidized regions are formed by the use of a multiplicity of cavities arranged in a pre-defined pattern in the laser structure. The lasing aperture is an unoxidized region bounded by these oxidized regions centered about the cavities. During the oxidation process, an AlGaAs layer with high aluminum content embedded in the semiconductor structure is oxidized radially outwards from each of these cavities until the oxidized regions between two adjacent cavities overlap. The AlGaAs layer with high aluminum content for forming the oxidized regions and the aperture is often referred to as an "oxidation layer."

An advantage of the present invention is that the dimension of the oxidized regions which define the lasing aperture is comparable to the dimension of the lasing aperture itself. Generally, the oxidation rates of AlGaAs depend upon material composition and process parameters, which exhibit significant non-uniformity. These non-uniformities have decreasing impact as the ratio of the size of the oxidized regions to the size of the final laser aperture is reduced. In other words, since the amount of oxidation required to form the lasing aperture is dramatically reduced, the aperture size is therefore much less sensitive to material or process variations. Hence, well-defined and well-controlled apertures can be achieved.

Another advantage of the present invention is that since the present invention does not require the formation of a relatively large and deep mesa structure, the distance between two lasers in an array is greatly reduced. Hence the present invention is particularly well-suited to the fabrication of highly compact lasers or high density laser arrays.

Yet another advantage of the present invention is that even higher density laser arrays can be fabricated if a transparent conductor is used to form the electrical contact of the laser devices.

A further advantage is that the present invention results in highly planar laser structures which avoid using mesa structures with a steep step height. Such a planar technology improves the structural and mechanical stability of the devices and further simplifies the formation of electrical contacts to the devices.

The advantages and objects of the present invention will become apparent to those skilled in the art from the following detailed description of the invention, its preferred embodiments, the accompanying drawings, and the appended claims.

DETAILED DESCRIPTION OF THE PREFERRED EMBODIMENTS

Figure 1:
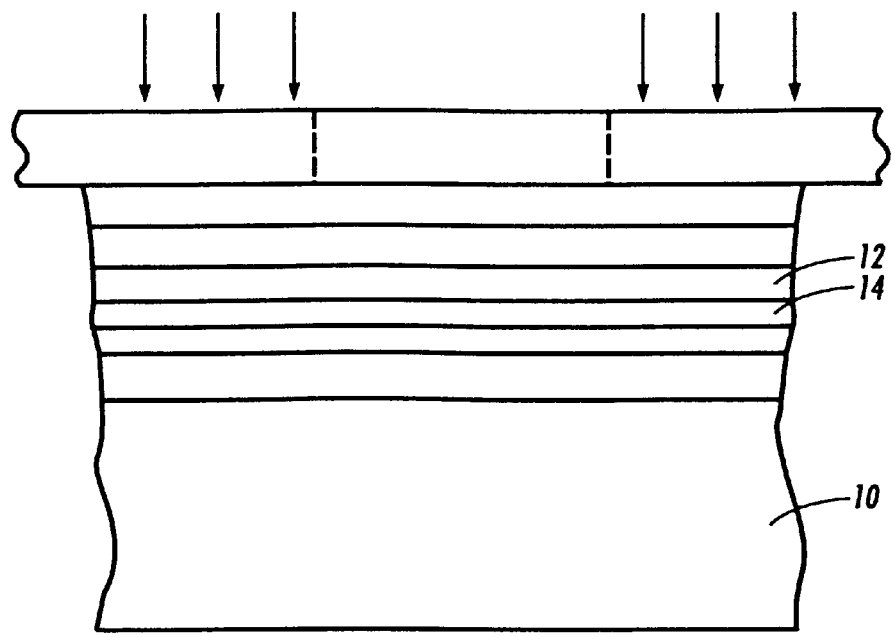
FIGS. 1 and 2 illustrate a prior art approach to the formation of a laser aperture in a VCSEL structure.
Figure 2:
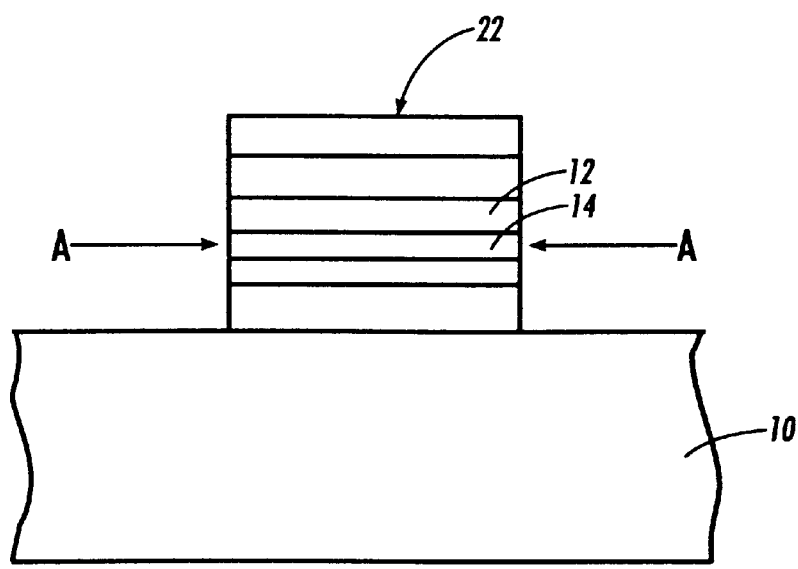
Figure 3:
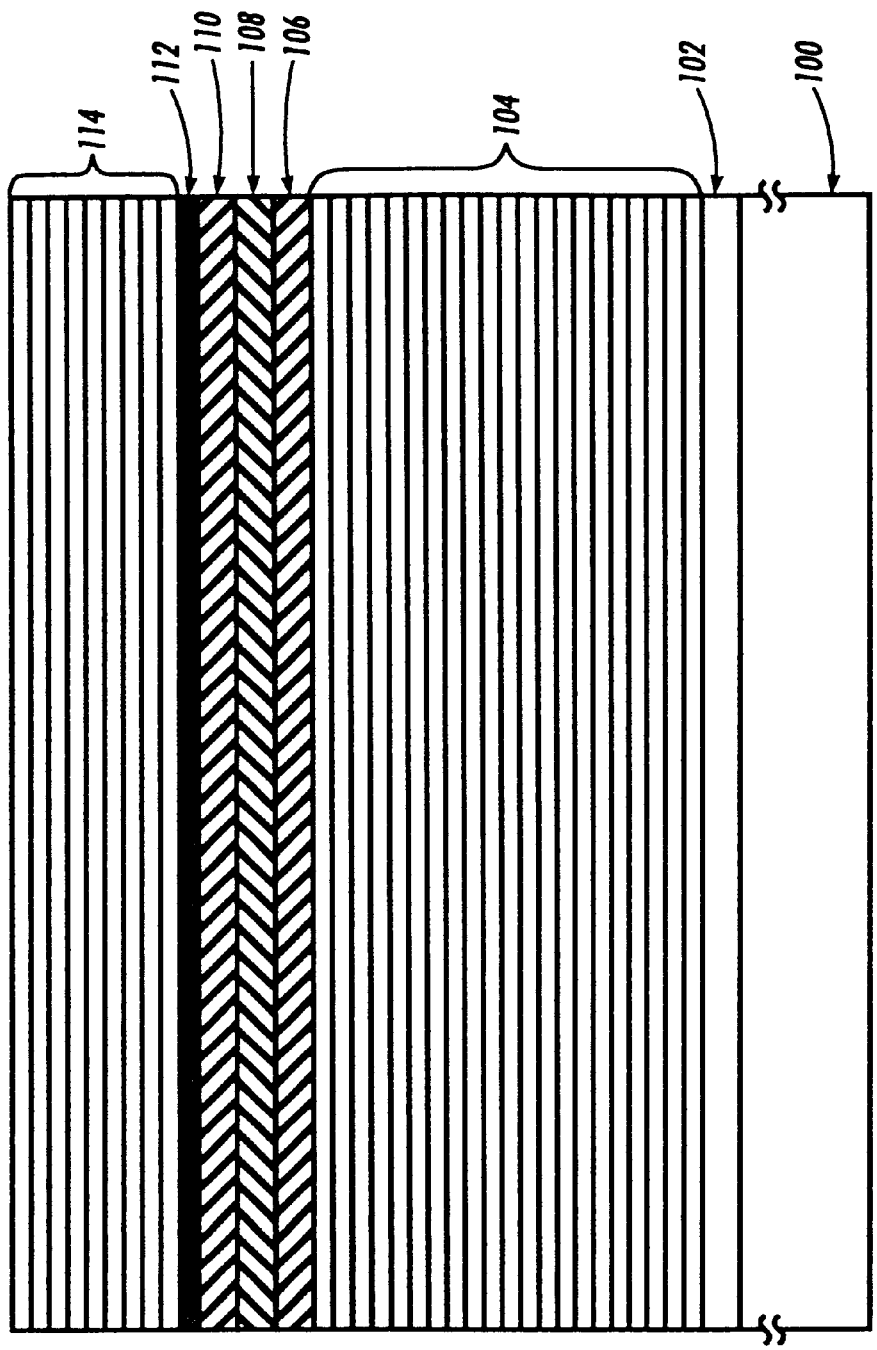
FIG. 3 illustrates a side sectional view of a semiconductor structure which is used to form the preferred embodiment of the present invention.

FIG. 3 illustrates a semiconductor structure which is used to form the preferred embodiment of the present invention. The structure illustrated includes a number of semiconductor layers, which can be used to form a vertical cavity surface emitting laser. As will be apparent, the layers are illustrated schematically only and bear no relationship to the relative thicknesses each to the other. As shown in FIG. 3, an n-type GaAs buffer layer 102 of approximately 200 nanometers is grown on an n-type GaAs substrate 100 using an epitaxial deposition process known as metal-organic chemical vapor deposition ("MOCVD"). The doping level of the n-type GaAs substrate and GaAs buffer are typically around the range of $3\times10^{18}$ cm$^{-3}$ to $7\times10^{18}$ cm$^{-3}$ so that a reasonably low resistance can be achieved in these layers. The semiconductor layers may also be deposited on a substrate by liquid phase epitaxy ("LPE"), molecular beam epitaxy ("MBE"), or other known crystal growth processes.

Above the GaAs buffer layer 102 is a superlattice structure for forming a lower distributed Bragg reflector ("DBR") 104 which provides a portion of the necessary internal reflection in a VCSEL structure. The lower DBR 104 is typically formed by multiple pairs of an AlGaAs layer with a high aluminum content and another AlGaAs layer with a low aluminum content. After the growth of a number of layer pairs, a final AlGaAs layer with a high aluminum content is deposited before growing the first cladding layer 106 of the optical cavity. A typical thickness of each layer pair is approximately 120 nanometers for a laser emitting at 820 nanometers. The total thickness of each layer pair is designed to be equal to one half of the optical wavelength at the intended wavelength of laser operation. The thickness of the final high aluminum content layer is designed to be a quarter of the optical wavelength at the intended wavelength of laser operation. The AlGaAs layer with a high aluminum content contains approximately 86% aluminum. The aluminum content of the AlGaAs layer with a high aluminum content should be sufficiently high to provide for a low refractive index, but not so high as to oxidize easily. The AlGaAs layer with a low aluminum content has an aluminum content of approximately 16%. The composition of the AlGaAs layer with a low aluminum content should typically have sufficient aluminum so that it is non-absorptive at the lasing wavelength.

Under this embodiment, since light is outcoupled through the top surface of the semiconductor sample, the reflectivity of the lower DBR 104 should be as close to 100% as possible in order to achieve high internal reflection. High internal reflection generally reduces the threshold current of a laser. It is well-known that the reflectivity of the lower DBR 104 is generally a function of the difference in the refractive indices between the two AlGaAs layers of the superlattice and the number of layer pairs in the structure. The greater the difference in the refractive indices, the fewer number of pairs are required to obtain a given reflectivity. Typically, 30 to 40 pairs of AlGaAs layers are used to form the lower DBR structure 104.

After the lower DBR structure 104 has been deposited epitaxially, an AlGaAs cladding layer 106 is deposited. This lower AlGaAs cladding layer 106 has an aluminum content of about 58% and is n-type with a doping level of $1 \times 10^{18}$ $cm^{-3}$ to $5 \times 10^{18}$ $cm^{-3}$. Its thickness is approximately 100 nanometers. Above this AlGaAs cladding layer 106 is the active layer 108 of the laser structure which comprises four quantum wells with a thickness of five to ten nanometers, separated by three barriers with a thickness of two to eight nanometers. Depending upon the desired output wavelength of the laser structure, pure GaAs or AlGaAs with a low aluminum content may be used to form the quantum well structures. Under this embodiment, these quantum wells are typically formed by undoped AlGaAs with an aluminum content of approximately 7%. Nothing in this invention prevents the use of a single quantum well or other multiple quantum well ("MQW") structures to form the active layer 108.

Above the active layer 108 is an upper AlGaAs cladding layer 110, which is structurally similar to the lower AlGaAs cladding layer 106 except for the polarity of its dopants. This upper cladding layer 110 has an aluminum content of about 58% but is p-type with a doping level of $1 \times 10^{18}$ $cm^{-3}$ to $4 \times 10^{18}$ $cm^{-3}$. Similar to the lower AlGaAs cladding layer 106, the thickness of top cladding layer 110 is also about 100 nanometers. These two AlGaAs cladding layers, 106 and 110, along with the active layer 108 generally form the optical cavity in which the desired optical gain can be attained. The total thickness of layers 106, 108, and 110 is adjusted to be equal to an integer multiple of the intended wavelength of laser operation.

Above the upper AlGaAs cladding layer 110 is an oxidation layer 112, which is used to form the laser aperture. The laser aperture controls the current flow and thus the lasing location in the active layer 108. Under this embodiment, this oxidation layer 112 is above the upper AlGaAs cladding layer 110. Nothing in this invention prevents the placement of this oxidation layer 112 in another location either further above or below the active layer 108. Typically, this oxidation layer 112 has an aluminum content of approximately 95% and a thickness of about 70 nanometers. Typically, this oxidation layer 112 constitutes the first layer of an upper DBR mirror and contains a p-type dopant.

After the oxidation layer 112 has been formed, the remainder of an upper DBR mirror 114 which contains p-type doping is deposited. The upper DBR mirror 114 is structurally similar to the lower DBR mirror 104 except for the polarity of its dopants. Additionally, the mirror layer closest to each side of the active region generally has a high aluminum content. In this embodiment, this high aluminum content layer is also the oxidation layer 112. In this embodiment, the reflectivity of the upper DBR 114 is typically 98% to 99% because light will be outcoupled through the surface of the semiconductor sample. Typically, 20 to 25 pairs of alternate AlGaAs layers are used to form this upper DBR mirror 114.

Figure 4:
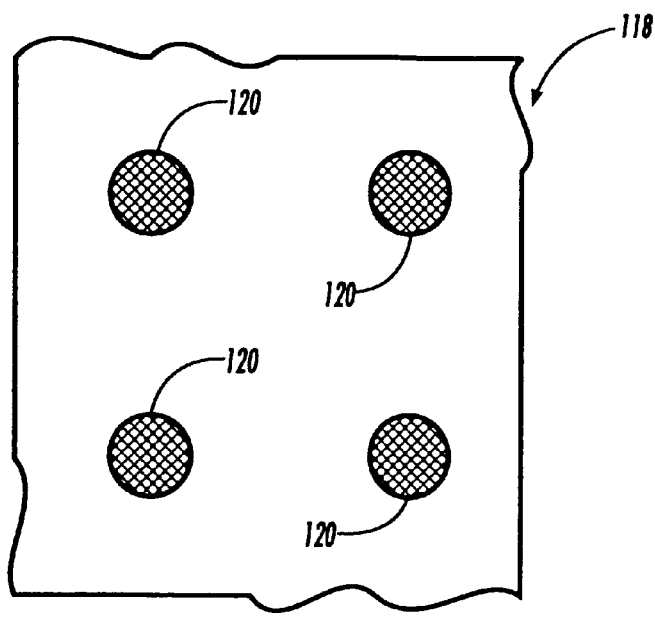
FIG. 4 is a top view of a portion of a mask which may be applied to the semiconductor structure shown in FIG. 3 under the present invention.

FIG. 4 is a top view of a portion of a mask which may be applied to the semiconductor structure shown in FIG. 3 under the present invention. First, as is conventional, a uniform layer of silicon nitride will be deposited over the entire semiconductor sample. Then, a photoresist layer 118 is deposited over the silicon nitride layer and is formed into the mask shown in FIG. 4 by a photolithographic process which removes photoresist material from four circular areas 120. The circular areas 120 form a predetermined bounding pattern which will later be used to define the resulting aperture of a laser structure.

Figure 5:
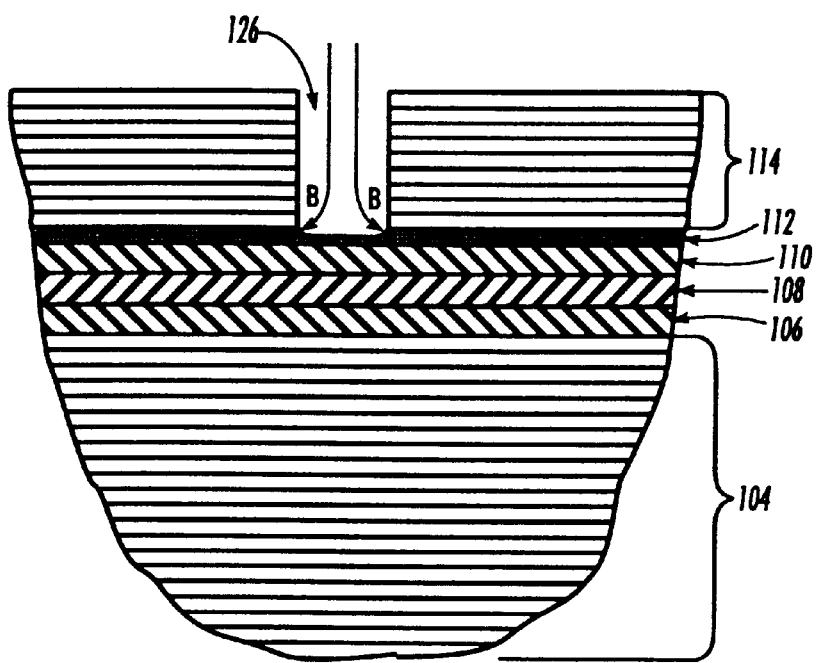
FIG. 5 is a partial side sectional view of the semiconductor structure of FIG. 3 with a cavity etched therein.
Figure 6:
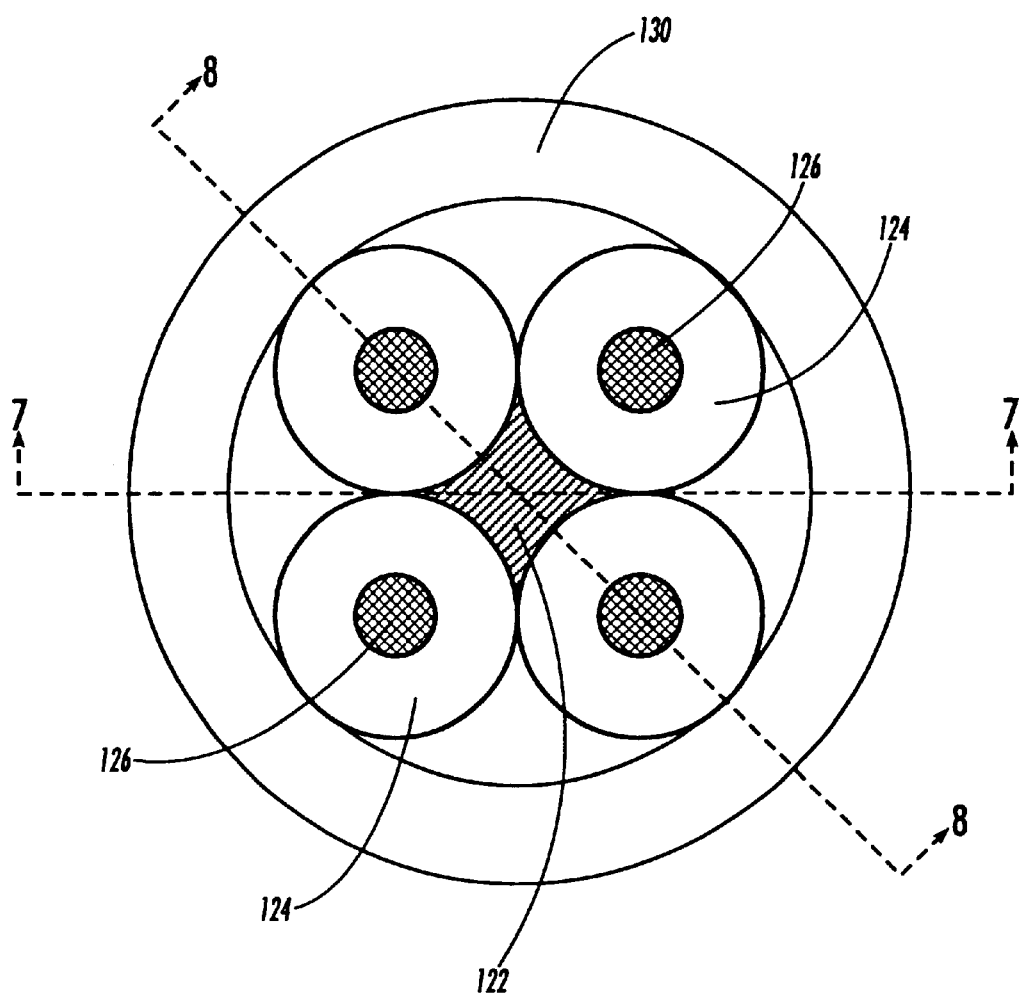
FIG. 6 is a simplified top view of a portion of an oxidation layer, wherein the layers above it have been removed.

As illustrated in FIG. 5, the sample then undergoes an etching process during which cylindrical cavities 126 are formed in the semiconductor structure through the four exposed circular areas 120. The etching is performed by a process such as reactive ion etching which provides for the formation of a deep depression with vertical sidewalls. The depth of each cylindrical cavity should extend at least into the oxidation layer 112, as shown in FIG. 5. After the formation of the cylindrical cavities and the removal of any photoresist on the surface, the semiconductor sample undergoes an oxidation. The sample is typically oxidized with water vapor in a nitrogen environment at elevated temperatures, in excess of 350° C. During the oxidation process, the oxidation layer 112 is exposed to the ambient through each cylindrical cavity, as indicated by arrows B. Thus, the oxidation layer 112, which comprises AlGaAs with a high aluminum content, is oxidized radially outwards from each cavity 126, typically until the oxidized regions 124 surrounding each cavity approach one another and overlap, as can be seen in FIG. 6. However, a small non-oxidized gap between the oxidized regions may be permissible so long as electrical and optical fields are adequately confined. Although the cross section of each cavity has been described as being cylindrical, any suitable cross section may be used.

During the oxidation process, other layers in the structure remain essentially unoxidized since their aluminum content is lower. The oxidation rate of AlGaAs increases with the aluminum content in a generally exponential manner at constant temperature. The time duration of the oxidation process depends upon the aluminum content in the oxidation layer 112 and the oxidation temperature. A desirable, controllable oxidation duration would be a few tens of minutes. Therefore, the layer that is being oxidized is the AlGaAs which has a high aluminum content of close to 95%. The portion of the AlGaAs layer which remains unoxidized controls the current path through the active layer 108.

FIG. 6 is a largely simplified top view of the oxidation layer 112 shown in FIG. 3 assuming that all the layers above it have been removed. The shaded region 122 represents the laser aperture in oxidation layer 112 which determines the region of laser emission by active layer 108. It is formed by the oxidation process of the present invention. During the oxidation process, the oxidation fronts emanate through the oxidation layer from the pattern of four cavities 126, and the shaded region 122 is formed by the intersection of the boundaries of the oxidized regions 124. The oxidation fronts emanating from the cylindrical cavities 126 are also generally cylindrical, resulting in overlapping oxidized regions 124. The center of the overlapping regions 124 remains unoxidized. This unoxidized region forms the shaded area 122, which is the aperture of the laser structure. After the oxidation process, an ion implantation process, which is next described, is used to form isolation region 130 to isolate the laser structure from its neighbor.

After the oxidation process, the areas 124 are oxidized and the unoxidized portion 122 forms the aperture which controls the current path through the active layer 108. Current flow through that portion of the active layer 108 which lies below the aperture 122 results in an injected density of p-type and n-type carriers, resulting in optical amplification. At sufficiently high current flow, this optical amplification, in combination with feedback from the DBR mirrors, 104 and 114, will result in laser oscillation and emission from the active layer within the region defined by aperture 122 in oxidation layer 112.

Isolation region 130 (illustrated in FIGS. 6, 7 and 8), which is formed by using an ion implantation isolation process, is highly resistive. The typical implantation energies used in such a process are 50 KeV, 100 KeV, and 200 KeV. The dose is typically $3 \times 10^{15}$ cm$^{-2}$ at each energy level. The ion used to form the isolation region 402 is hydrogen.

Figure 7:
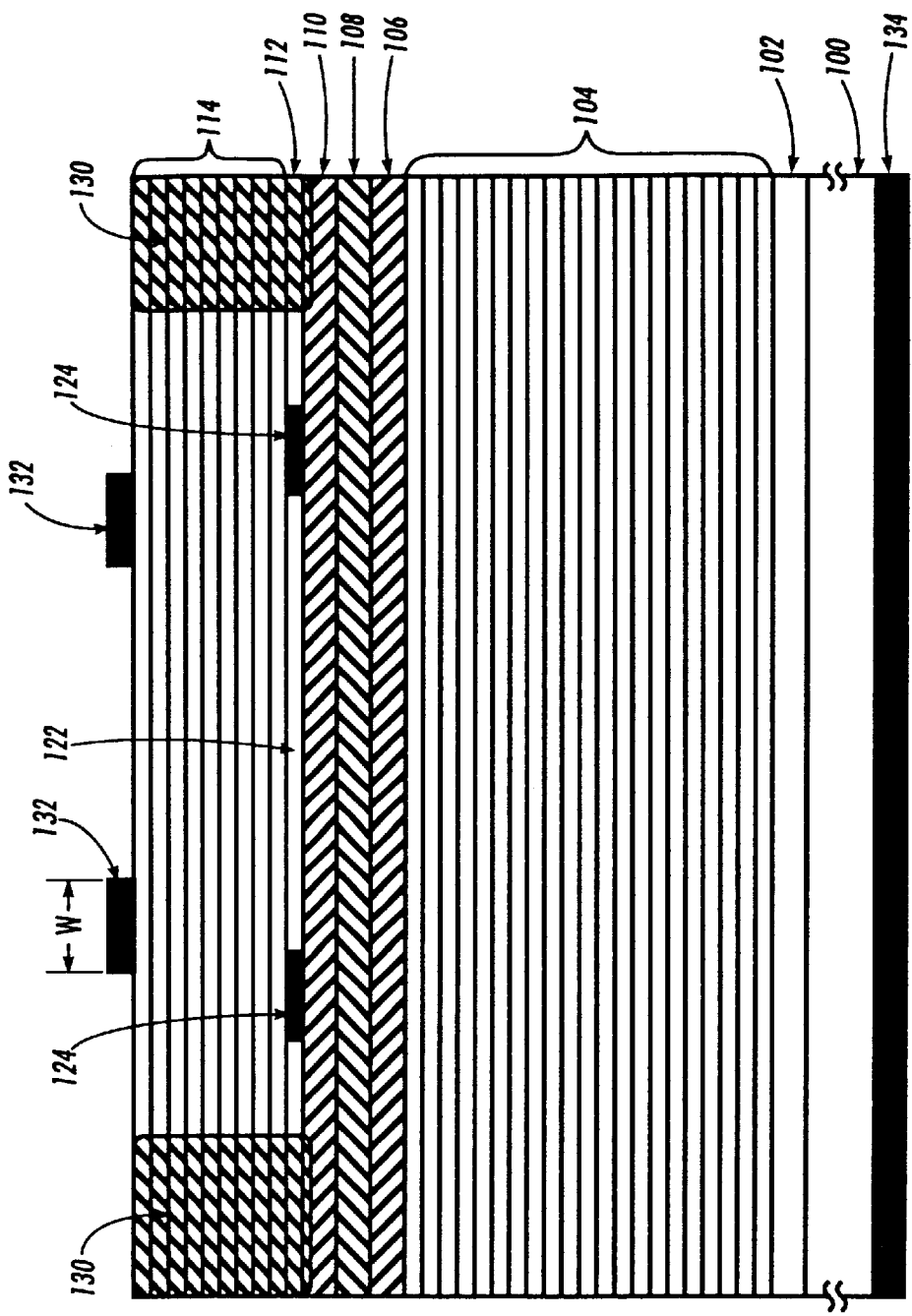
FIG. 7 is a cross-sectional view taken substantially along line 7—7 in FIG. 6 and in FIG. 9.
Figure 8:
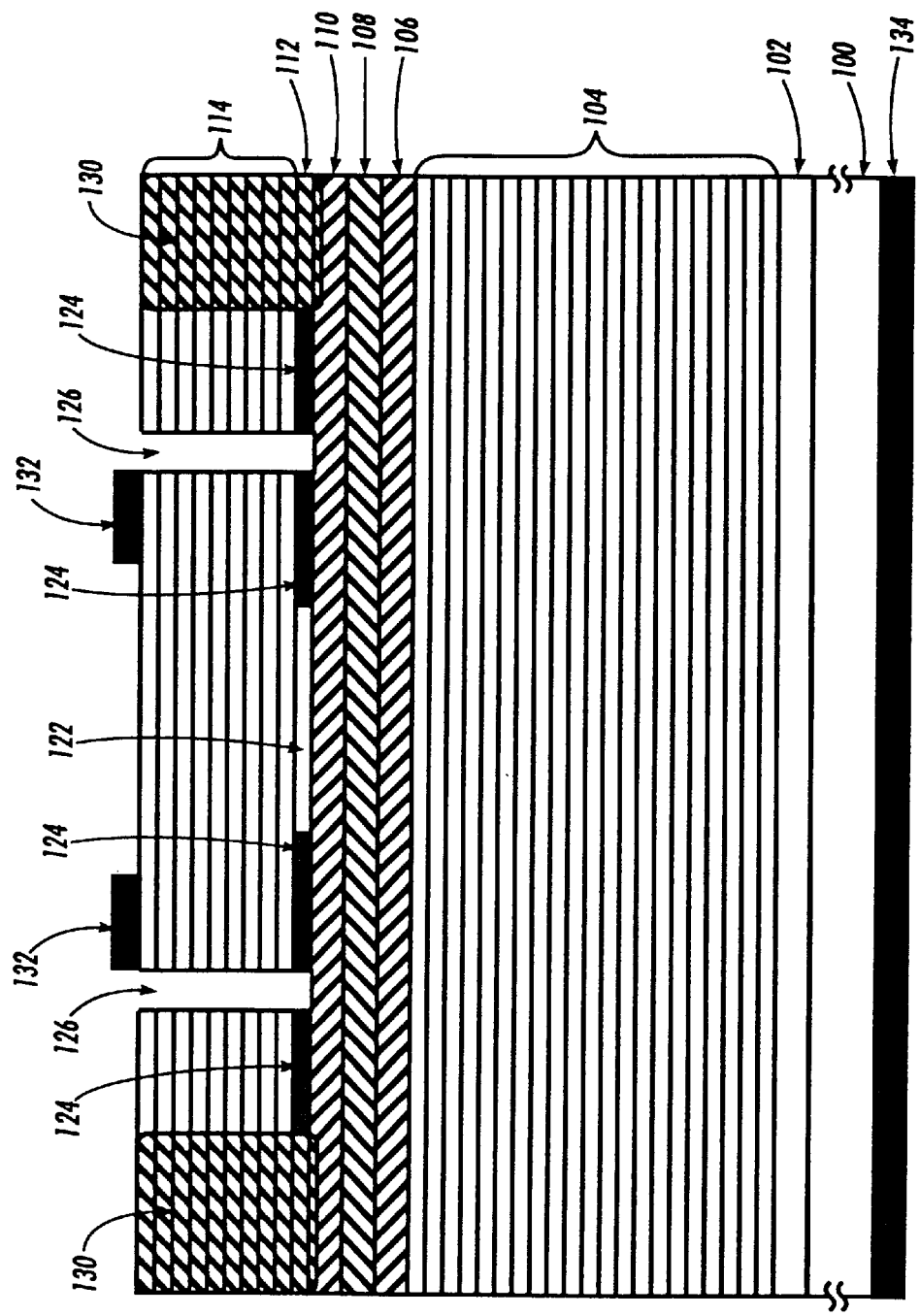
FIG. 8 is a cross-sectional view taken substantially along line 8—8 in FIG. 6 and in FIG. 9.
Figure 9:
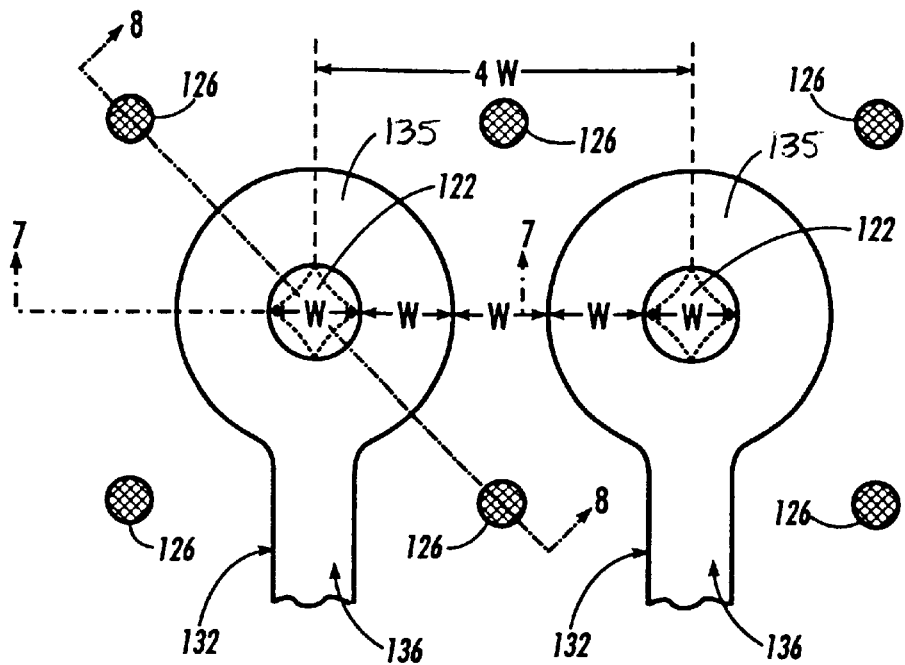
FIG. 9 is a top view of two adjacent VCSEL structures showing a non-transparent top contact.

After the isolation process, metal contacts 132 and 134 are formed on the top surface and the bottom surface of the semiconductor structure, respectively, for biasing the laser, as illustrated in FIGS. 7, 8 and 9. A typical material used for forming the contacts is a titanium/gold bilayer film.

Figure 10:
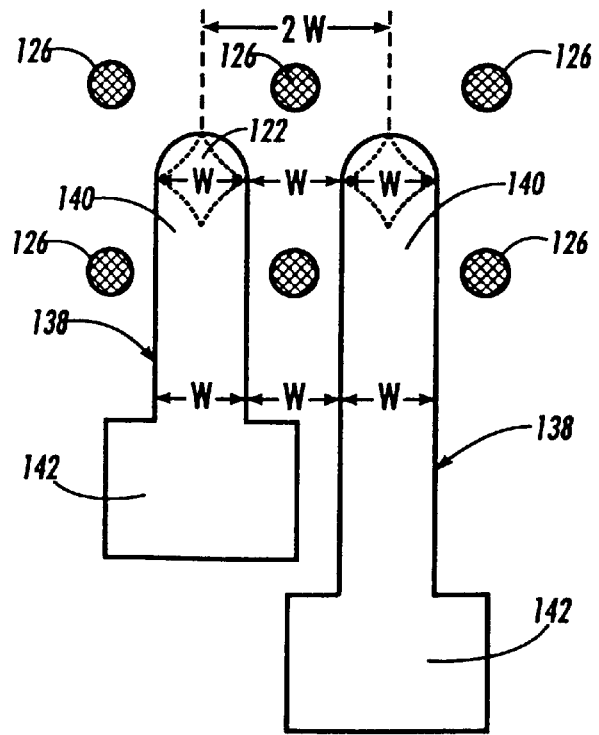
FIG. 10 is a top view of two adjacent VCSEL structures showing a transparent top contact.
Figure 11:
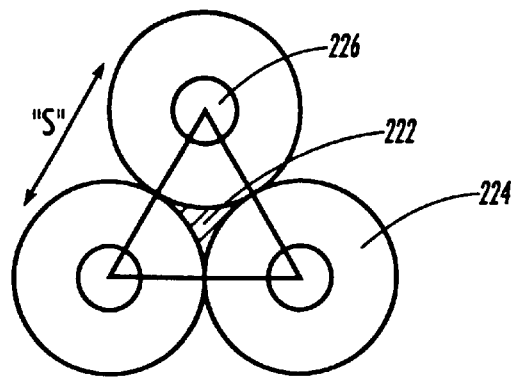
FIG. 11 shows a laser structure whose aperture is defined by a triangular bounding pattern of cavities.

FIG. 9 shows a top view of a VCSEL structure formed in accordance to the present invention after a typical metallization process to form the top contact 132. Views in the direction of section lines 7—7 and 8—8 in this Figure are also as illustrated in FIGS. 7 and 8. The top contact 132 is of a generally keyhole shape, including a circular portion 135 and an extension portion 136. The circular portion lies inboard of the cavities 126 and overlies the laser aperture 122. Since it is non-transparent it is made annular in shape so as to allow light to be coupled out of the laser through its central opening. The width "W" of the annular circular portion 135 is usually limited by the minimum line width achievable under the processing technology used, thus setting a lower limit on the pitch between adjacent VCSEL structures Thus, a typical pitch between the centers of two adjacent VCSEL apertures 122 would be "4W." However, if a transparent conductor is used, the pitch between adjacent VCSEL structures could be further reduced because the top contact could overlie the laser aperture 122. Thus, the pitch may be reduced to the order of "2W" as shown in FIG. 10. A typical transparent conductor is indium tin oxide ("ITO") which may be deposited by a sputtering process. An alternative embodiment of the top contact is shown in FIG. 10 and is identified by numeral 138. It comprises a transparent conductive contact finger 140 and contact pad 142, the contact finger overlying the laser aperture 122. After the formation of an electrical contact on the top surface, the bottom electrode 134 is formed by depositing metal on the bottom surface of the substrate 100.

Figure 12:
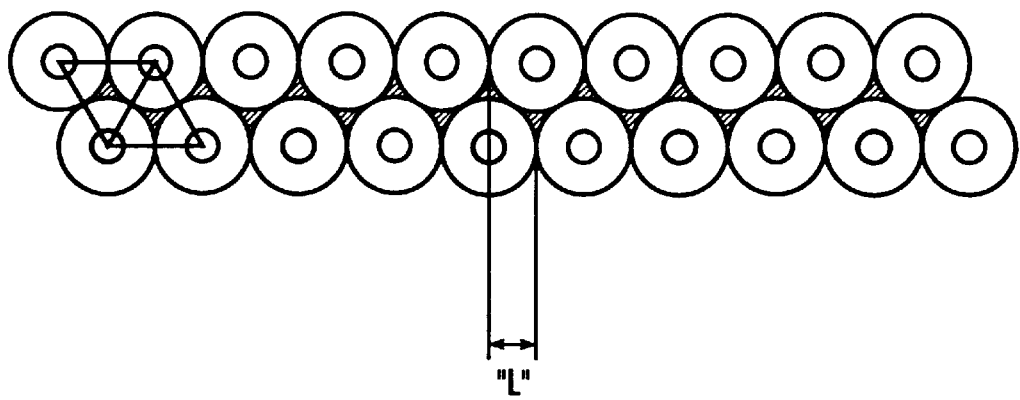
FIG. 12 shows an array of lasers which is formed by repeating the triangular bounding pattern shown in FIG. 11.

FIGS. 11, and 12, 13, 14 and 15, and 16, 17 and 18 illustrate alternative packing arrangements for forming an array of lasers formed by the method of the present invention. In the laser device of FIG. 11 and an array of such devices shown in FIG. 12, each laser structure includes an aperture 222 defined by oxidized regions 224 surrounding a bounding pattern of three cylindrical cavities 226 positioned at the apexes of an equilateral triangle. The spacing between the centers of any two cavities is "S." As stated previously, during the oxidation process, an embedded AlGaAs layer with a high aluminum content will be oxidized radially outwardly from the cylindrical cavities 226 until the oxidized regions 224 overlap to form the unoxidized laser aperture 222. The packing arrangement shown in FIG. 11 may be repeated to form a laser array as shown in FIG. 12. If the spacing between the centers of two cylindrical cavities is "S," a typical linear spacing "L" between two laser apertures is approximately "S/2."

Figure 13:
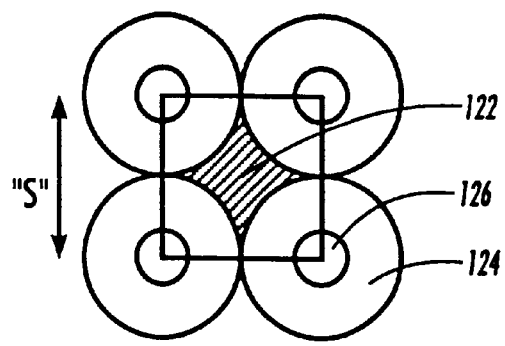
FIG. 13 shows a laser structure whose aperture is defined by a bounding pattern of four cavities arranged in a square pattern.
Figure 14:
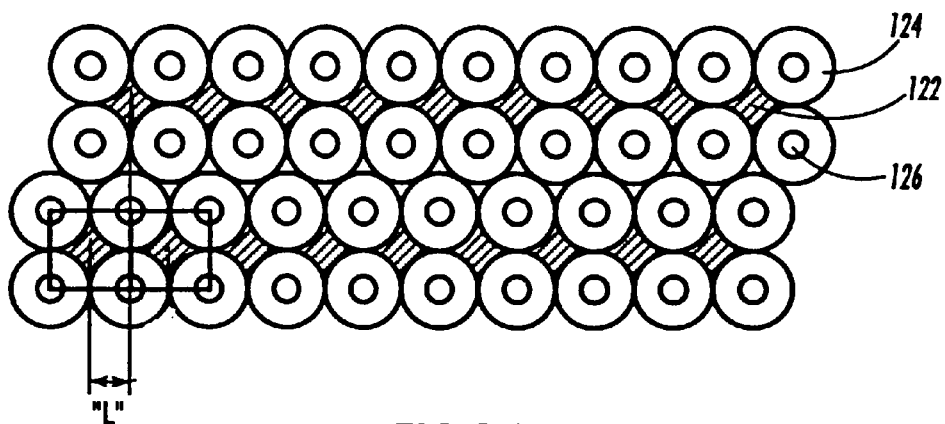
FIG. 14 shows an array of lasers which is formed by repeating the square bounding pattern shown in FIG. 13.
Figure 15:
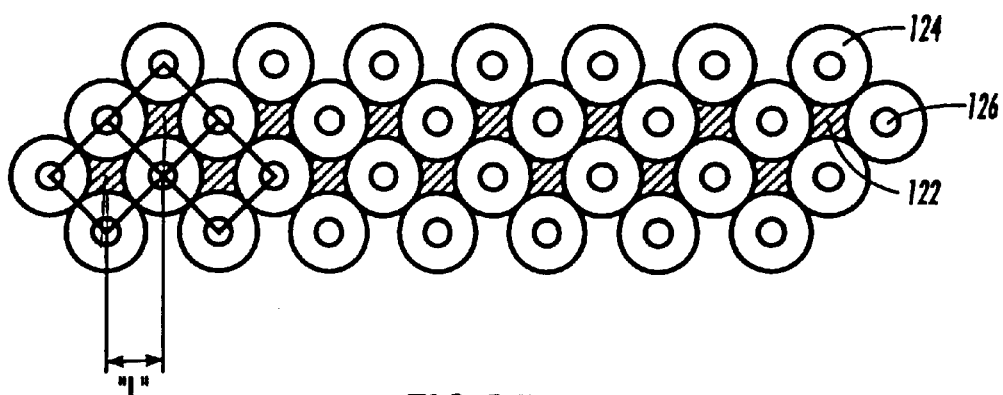
FIG. 15 shows another array of lasers which is formed by repeating the square bounding pattern shown in FIG. 13.

In the laser device of FIG. 13 and the arrays of FIGS. 14 and 15, the square bounding pattern of cylindrical cavities 126 is illustrated. Oxidized regions 124 will overlap to form the unoxidized laser aperture 122. This packing arrangement shown in FIG. 13 may be repeated to form a laser array as shown in FIG. 14 or 15 If a packing arrangement such as FIG. 14 is used and the spacing between the centers of two adjacent cylindrical cavities is "S," a typical linear spacing "L" between two laser apertures is approximately "S." If an arrangement such as FIG. 15 is used and the spacing between the centers of two cylindrical depressions is "S," a typical linear spacing "L" between two laser apertures is approximately "$\sqrt{2} \times S$."

Figure 16:
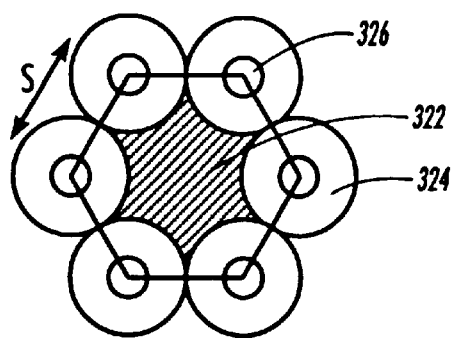
FIG. 16 shows a laser structure whose aperture is defined by a bounding pattern of six cavities arranged in an hexagonal pattern.
Figure 17:
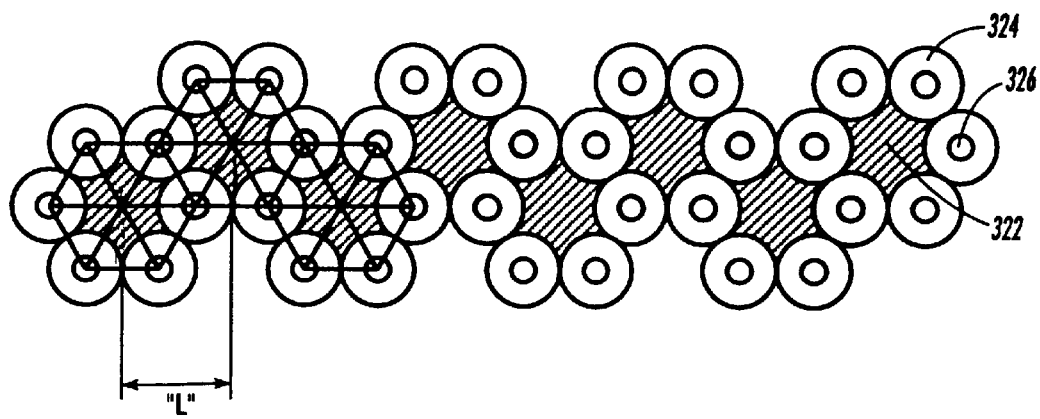
FIG. 17 shows an array of lasers which is formed by repeating the hexagonal bounding pattern shown in FIG. 16.
Figure 18:
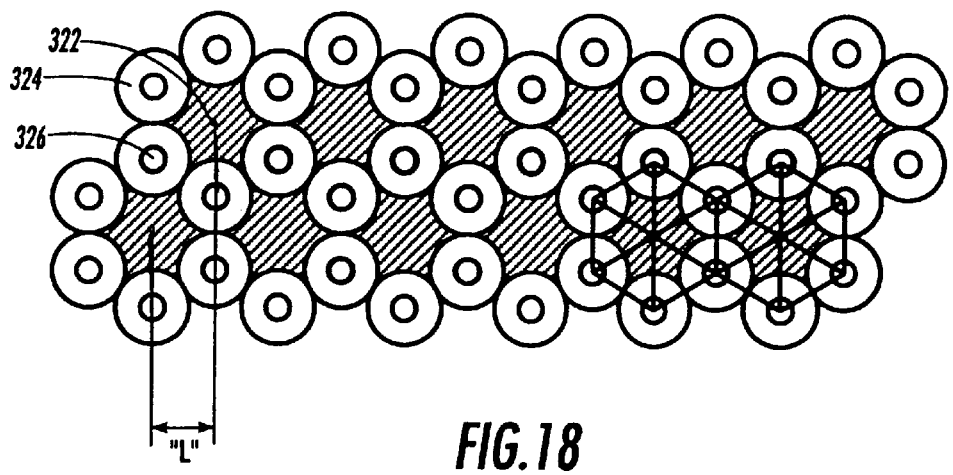
FIG. 18 shows another array of lasers which is formed by an alternative repeating of the hexagonal bounding pattern shown in FIG. 16.

In the laser device of FIG. 16 and the arrays of FIGS. 17 and 18 an hexagonal bounding pattern of cylindrical cavities is illustrated It should be apparent that the cavities 326 may also be arranged at the vertices of any other polygon. As in the previously described embodiments, the laser aperture is formed by the unoxidized region 322 defined by the oxidized regions 324. The packing arrangement shown in FIG. 16 may be repeated to form a laser array as shown in FIG. 17 or 18. If an arrangement such as FIG. 17 is used and the spacing between the centers of two adjacent cylindrical cavities is "S," a typical linear spacing "L" between two laser apertures is approximately "1.5S." If an arrangement such as FIG. 18 is used, the closest linear spacing "L" between two laser apertures is approximately "$\sqrt{3} \times 0.5S$."

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and GaAlAs, other semiconductor materials such as GaAlSb, InAlGaP, or other III–V alloys may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method of forming a laser device, having a light emitting surface, comprising the steps of:

forming a substrate;

forming a plurality of semiconductor layers on said substrate wherein one of said semiconductor layers comprises an active layer and another of said semiconductor layers comprises a current controlling layer;

forming a plurality of cavities disposed in a bordering pattern, said plurality of cavities extending from said light emitting surface into said current controlling layer;

exposing portions of said current controlling layer to an oxidizing environment through said plurality of cavities to create oxidized regions in said current controlling layer that approach one another so as to form a non-conductive region therebetween; and forming first and second electrodes located on said laser device to enable biasing of said active region.

2. The method of claim 1 wherein said current controlling layer is an oxidation layer and said non-conductive regions are oxidized portions of said oxidation layer.

3. The method of claim 2 wherein said oxidation layer comprises an aluminum containing semiconductor layer.

4. The method of claim 1 wherein said first electrode is located substantially on said light emitting surface.

5. The method of claim 4 wherein said first electrode is non-transparent and includes an opening therein through which light energy may be transmitted out of said laser device.

6. The method of claim 1 wherein said plurality of semiconductor layers comprises a Group III–IV arsenide metal.

7. The method of claim 1 wherein said plurality of cavities are disposed in an equilateral triangular bordering pattern.

8. The method of claim 1 wherein said plurality of cavities are disposed in a square bordering pattern.

9. The method of claim 1 wherein said plurality of cavities are disposed in a regular hexagonal bordering pattern.

10. The method of claim 1 wherein at least one of said plurality of cavities has a cylindrical cross-section.

* * * * *